US008031003B2

(12) United States Patent
Dishop

(10) Patent No.: US 8,031,003 B2
(45) Date of Patent: Oct. 4, 2011

(54) SOLID-STATE RF POWER AMPLIFIER FOR RADIO TRANSMITTERS

(76) Inventor: Steven M. Dishop, Bellefontaine, OH (US)

(*) Notice: Subject to any disclaimer, the term of this patent is extended or adjusted under 35 U.S.C. 154(b) by 0 days.

(21) Appl. No.: 12/714,609

(22) Filed: Mar. 1, 2010

(65) Prior Publication Data

US 2010/0156537 A1 Jun. 24, 2010

Related U.S. Application Data

(63) Continuation-in-part of application No. 11/749,786, filed on May 17, 2007, now Pat. No. 7,683,718.

(60) Provisional application No. 60/747,662, filed on May 18, 2006, provisional application No. 60/801,006, filed on May 17, 2006.

(51) Int. Cl.
*H03F 3/26* (2006.01)
(52) U.S. Cl. ........................ 330/276; 330/269; 330/275
(58) Field of Classification Search .................. 330/269, 330/275, 276, 301
See application file for complete search history.

(56) References Cited

U.S. PATENT DOCUMENTS

| | | | |
|---|---|---|---|
| 5,420,537 A | 5/1995 | Weedon et al. | |
| 5,477,188 A | 12/1995 | Chawla et al. | |
| 5,726,603 A | 3/1998 | Chawla et al. | |
| 6,046,641 A | 4/2000 | Chawla et al. | |
| 6,157,258 A | 12/2000 | Adishian et al. | |
| 6,496,069 B1 * | 12/2002 | Van De Westerlo | 330/276 |

OTHER PUBLICATIONS

Blocksome, HF Radio Systems & Circuits, 1998; pp. 458-479, 498-511, Noble Publishing Corporation, Atlanta, GA; USA.
Granberg, AN593, "Broadband Linear Power Amplifiers: Using Push-Pull Transistors," RF Application Reports, 1993; Motorola Literature Distribution, Phoenix, AZ; USA.
Granberg, AN749, "Broadband Transformers & Power Combining Techniques for RF, " RF Application Reports, 1993; Motorola Literature Distribution, Phoenix, AZ; USA.
Granberg, AN 758, "A Two-Stage 1kW Sold State Linear Amplifier," RF Application Reports, 1994; Motorola Literature Distribution, Phoenix, AZ; USA.
Granberg, AN762, "Linear Amplifiers for Mobile Operation," RF Application Reports, Jun. 1984; Motorola Literature Distribution, Phoenix, AZ; USA.

(Continued)

*Primary Examiner* — Khanh Nguyen
(74) *Attorney, Agent, or Firm* — Pearne & Gordon LLP

(57) ABSTRACT

An RF power amplifier includes a push-pull amplifier having field effect transistors. Temperature compensating bias circuitry provides a temperature compensated bias voltage to the transistors for decreasing the bias voltage thereof as temperature increases. The temperature compensating bias circuitry includes a temperature sensor generating a temperature signal. A first amplifier provides a first temperature dependent voltage based on the temperature signal. A second amplifier provides a second temperature dependent voltage based on the temperature signal. The first and second temperature dependent voltages change at substantially the same rate in response to the temperature signal. A potentiometer receives the first and second temperature dependent voltages such that a voltage across the potentiometer remains substantially constant when the first and second temperature dependent voltages change. An output of the bias circuitry is connected to at least one of the transistors and supplies the temperature compensated bias voltage to the at least one of the transistors.

30 Claims, 11 Drawing Sheets

OTHER PUBLICATIONS

Granberg, AR176, "New MOSFETs Simplify High Power RF Amplifier Design," RF Application Reports, 1995; pp. 412-417, Motorola Literature Distribution, Phoenix, AZ; USA.

Granberg, AR313, "Wideband RF Power Amplifier," RF Application Reports, Apr. 1991; Motorola Literature Distribution, Phoenix, AZ; USA.

Granberg, AR347, "A Compact 1-kw 2-50 MHz Solid-State Linear Amplifier," RF Application Reports, Dec. 1991; Motorola Literature Distribution, Phoenix, AZ; USA.

Granberg, AR580, "MOSFET RF Power: An update," QST Magazine, Jan. 1983; pp. 13-16, 30-33, vol. 67, No. 1, American Radio Relay League, Inc., Newington, CT; USA.

Granberg, EB104, "Get 600 Watts RF from Four Power FET's," Engineering Bulletin, Sep. 1993; Motorola Literature Distribution, Phoenix, AZ; USA.

Granberg, AR305, "Building Push-Pull, Multioctave, VHF Power Amplifiers," 1987, Motorola Semiconductor Products Inc., Phoenix, AZ; USA.

* cited by examiner

SOLID-STATE RF POWER AMPLIFIER FOR RADIO TRANSMITTERS

CROSS-REFERENCE TO RELATED APPLICATIONS

This application is a continuation-in-part of U.S. patent application Ser. No. 11/749,786, filed on May 17, 2007, which claims the benefit of U.S. Provisional Patent Application Ser. No. 60/801,006, filed May 17, 2006 and the benefit of U.S. Provisional Patent Application Ser. No. 60/747,662, filed May 18, 2006. The respective disclosures in the above-referenced applications are incorporated herein by reference in their entireties.

BACKGROUND OF THE INVENTION

1. Field of the Invention

The present invention relates to power amplifiers, and more particularly to radio frequency (RF) power amplifiers employing high voltage and high power metal-oxide semiconductor field-effect transistors (MOSFET).

2. Description of Related Art

High-power RF amplifiers adapted to operate over a range of 1-60 MHz without tuning have typically employed vacuum tubes. It would be desirable to provide a high-power RF amplifier for operation over a range of 1-60 MHz, and which employs a minimum number of MOSFET transistors instead of vacuum tubes.

BRIEF SUMMARY OF THE INVENTION

In accordance with one aspect of the invention, provided is an RF power amplifier including a first field effect transistor having a first gate, a first source, and a first drain, having an output power rating of at least 200 watts, and operating with a drain-to-source voltage that is greater than 50 VDC. The amplifier includes a second field effect transistor having a second gate, a second source, and a second drain, having an output power rating of at least 200 watts, and operating with a drain-to-source voltage that is greater than 50 VDC. The transistors are configured as a push-pull amplifier. The amplifier further includes an RF signal input. An input transformer is connected to the RF signal input. The input transformer has respective balanced outputs connected to the first gate and the second gate. A broadband output transformer has a first balanced input connected to the first drain, and a second balanced input connected to the second drain. The broadband output transformer has an input to output impedance ratio of 1:4 and at least some flux cancellation occurs within the broadband output transformer. Temperature compensating bias circuitry provides a temperature compensated bias voltage to the first field effect transistor and the second field effect transistor for decreasing the bias voltage of the first field effect transistor and the second field effect transistor as transistor temperature increases, in order to maintain a constant bias current level over temperature. The temperature compensating bias circuitry includes a temperature sensor generating a temperature signal. A first amplifier has an output providing a first temperature dependent voltage based on the temperature signal. A second amplifier has an output providing a second temperature dependent voltage based on the temperature signal. The first temperature dependent voltage and the second temperature dependent voltage change at substantially the same rate in response to the temperature signal. A potentiometer is connected to the output of the first amplifier and the output of the second amplifier such that a voltage across the potentiometer remains substantially constant when the first temperature dependent voltage and the second temperature dependent voltage change. A bias output of the temperature compensating bias circuitry is connected to at least one of the first field effect transistor and the second field effect transistor and supplies the temperature compensated bias voltage to the at least one of the first field effect transistor and the second field effect transistor.

In accordance with another aspect of the invention, provided is an RF power amplifier including a first plurality of field effect transistors having directly interconnected drains and respective output power ratings of at least 100 watts, and a second plurality of field effect transistors having directly interconnected drains and respective output power ratings of at least 100 watts. The transistors operate with a drain-to-source voltage that is greater than 50 VDC. The first plurality of field effect transistors and the second plurality of field effect transistors together form a push-pull amplifier having an output power rating of at least 400 watts. The amplifier further includes an RF signal input. An input transformer is connected to the RF signal input. The input transformer has respective balanced outputs connected to the gates of the transistors. A broadband output transformer has a first balanced input connected to the drains of the first plurality of field effect transistors, and a second balanced input connected to the drains of the second plurality of field effect transistors. The broadband output transformer has an input to output impedance ratio of 1:4 and at least some flux cancellation occurs within the broadband output transformer. Temperature compensating bias circuitry provides a temperature compensated bias voltage to the first plurality of field effect transistors and the second plurality of field effect transistors for decreasing the bias voltage of the first plurality of field effect transistors and the second plurality of field effect transistors as transistor temperature increases, in order to maintain a constant bias current level over temperature. The temperature compensating bias circuitry includes a temperature sensor generating a temperature signal. A first amplifier has an output providing a first temperature dependent voltage based on the temperature signal. A second amplifier has an output providing a second temperature dependent voltage based on the temperature signal. The first temperature dependent voltage and the second temperature dependent voltage change at substantially the same rate in response to the temperature signal. A potentiometer is connected to the output of the first amplifier and the output of the second amplifier such that a voltage across the potentiometer remains substantially constant when the first temperature dependent voltage and the second temperature dependent voltage change. A bias output of the temperature compensating bias circuitry is connected to at least one of the first plurality of field effect transistors and the second plurality of field effect transistors and supplies the temperature compensated bias voltage to the at least one of the first plurality of field effect transistors and the second plurality of field effect transistors.

In accordance with another aspect of the invention, provided is an RF power amplifier including a push-pull amplifier, the push-pull amplifier comprising a first field effect transistor and a second field effect transistor. Temperature compensating bias circuitry provides a temperature compensated bias voltage to the first field effect transistor and the second field effect transistor for decreasing the bias voltage of the first field effect transistor and the second field effect transistor as transistor temperature increases. The temperature compensating bias circuitry includes a temperature sensor generating a temperature signal. A first amplifier has an output providing a first temperature dependent voltage based on the temperature signal. A potentiometer is connected to the output of the first amplifier such that a voltage across the potentiometer remains substantially constant when the first temperature dependent voltage changes. A bias output of the temperature compensating bias circuitry is connected to at least one of the first field effect transistor and the second field effect transistor and supplies the temperature compensated bias voltage to the at least one of the first field effect transistor and the second field effect transistor.

In accordance with another aspect of the invention, provided is an RF power amplifier including a push-pull amplifier, the push-pull amplifier comprising a first field effect transistor having a first drain and a second field effect transistor having a second drain. A broadband output transformer has a first balanced input and a second balanced input. A first DC-blocking transformer is connected between the first balanced input and the first drain. A second DC-blocking transformer is connected between the second balanced input and the second drain.

In accordance with another aspect, provided is an RF power amplifier. The RF power amplifier includes a first amplifier module and a second amplifier module. The first amplifier module comprises a first push-pull amplifier including a plurality of field effect transistors and a first output balun transformer. An output impedance of the first amplifier module is 25 ohms. The second amplifier module comprises a second push-pull amplifier including a plurality of field effect transistors and a second output balun transformer. The output impedance of the second amplifier module is 25 ohms. A combiner is connected to the first amplifier module and the second amplifier module. The combiner comprises an unbalanced-to-unbalanced output transformer having an input-to-output impedance ratio of 1:4. The combiner combines an output from the first amplifier module and an output from the second amplifier module into a combined signal. The combined signal is supplied to the unbalanced-to-unbalanced output transformer. An output impedance of the combiner is 50 ohms.

DETAILED DESCRIPTION OF THE INVENTION

As used herein, the terms "connected" and "connected to" refer a physical and/or electrical joining or linking of one thing to another, and includes direct and indirect connections. For example, an amplifier can be connected to an RF signal input by direct electrical connection between the amplifier and input, or connected to said input via an indirect electrical connection, such as through an interposing resistor or capacitor. In the former case, the amplifier is directly connected to the input. In the latter case, the amplifier is indirectly connected to the input. However, in both cases, the amplifier is connected to the RF input.

Figure 1:
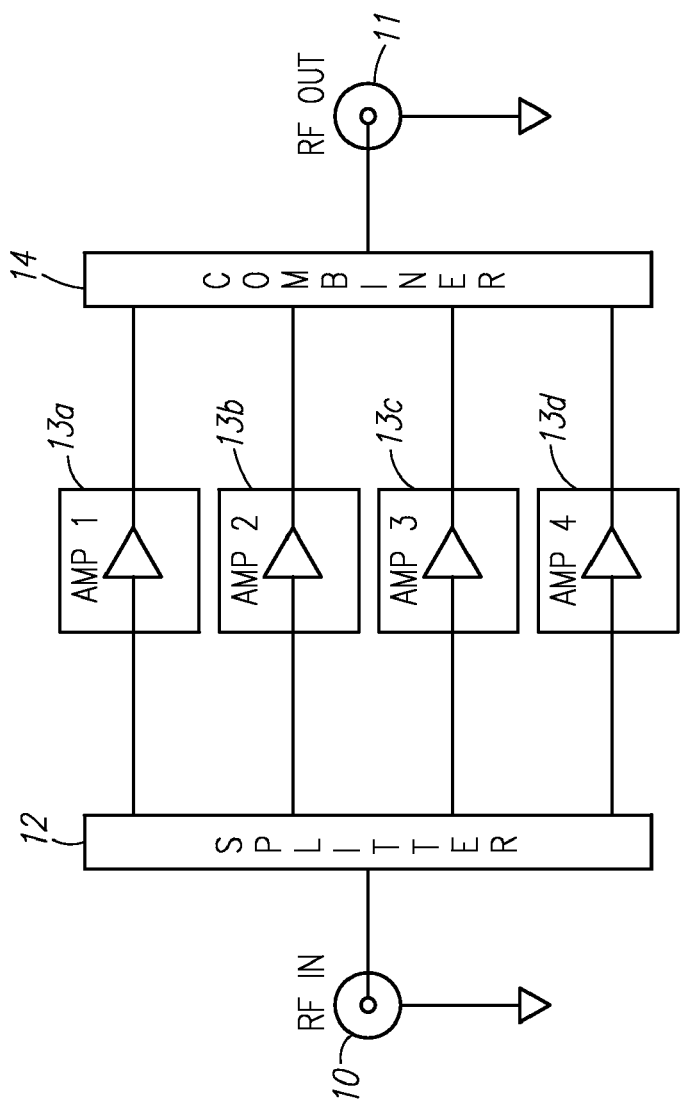
FIG. 1 is a top-level schematic block diagram of a modular RF power amplifier system.

FIG. 1 shows a top level schematic block diagram of a modular RF power amplifier system. The amplifier system includes an RF input terminal 10 and an RF output terminal 11. In an embodiment, the characteristic impedance of the input and output terminals is 50 ohms. The terminals 10, 11 can be adapted for use with removable connectors. For example, the terminals 10, 11 can include a BNC or SMA female connector for removably connecting to a BNC or SMA male connector, respectively.

An RF signal to be amplified by the amplifier system is provided at the RF input terminal 10. The RF signal is split by splitter 12 into separate signals to be amplified by a number of power amplifier modules 13a-13d. In the example of FIG. 1, four power amplifier modules 13a-13d are provided. Therefore, the splitter 12 splits the RF signal into four separate signals. It is to be appreciated that fewer than four power amplifier modules could be provided, such as two or three amplifier modules, for example. It is to be further appreciated that greater than four power amplifier modules could be provided, such as six or eight amplifier modules, for example. The splitter 12 is designed to split the RF input signal into as many separate signals as there are power amplifier modules. The splitter 12 can include a cascade of separate splitters for staged splitting of the RF input signal into a number of separate signals.

The power amplifier modules 13a-13d amplify the separate signals from the splitter 12 according to the power ratings of the amplifier modules 13a-13d. In an embodiment, each power amplifier module 13a-13d has a power rating of 400 watts. A modular RF power amplifier system employing four 400 watt power amplifier modules would provide approximately 1600 watts of total amplification. In another embodiment, each power amplifier module 13a-13d has a power rating of 600 watts. A modular RF power amplifier system employing four 600 watt power amplifiers would provide approximately 2400 watts of total amplification. In still another embodiment, each power amplifier module 13a-13d has a power rating of 1200 watts. A modular RF power amplifier system employing four 1200 watt power amplifiers would provide approximately 4800 watts of total amplification. In still another embodiment, each power amplifier module 13a-13d has a power rating of 1500 watts. A modular RF power amplifier system employing four 1500 watt power amplifies would provide approximately 6000 watts of total amplification. As discussed above, fewer than four power amplifier modules could be provided or greater than four power amplifier modules could be provided. The number of power amplifier modules to be used and their power ratings can be chosen based on the required power output.

Figure 2A:
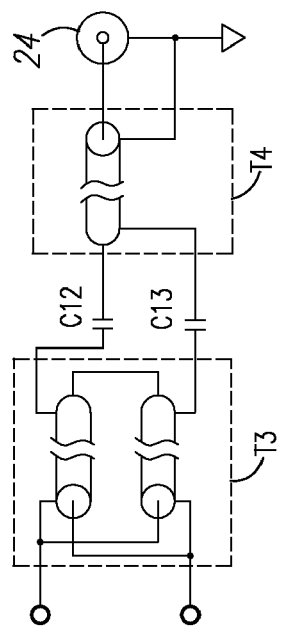
FIG. 2a is a schematic circuit diagram of a portion of FIG. 2.
Figure 2:
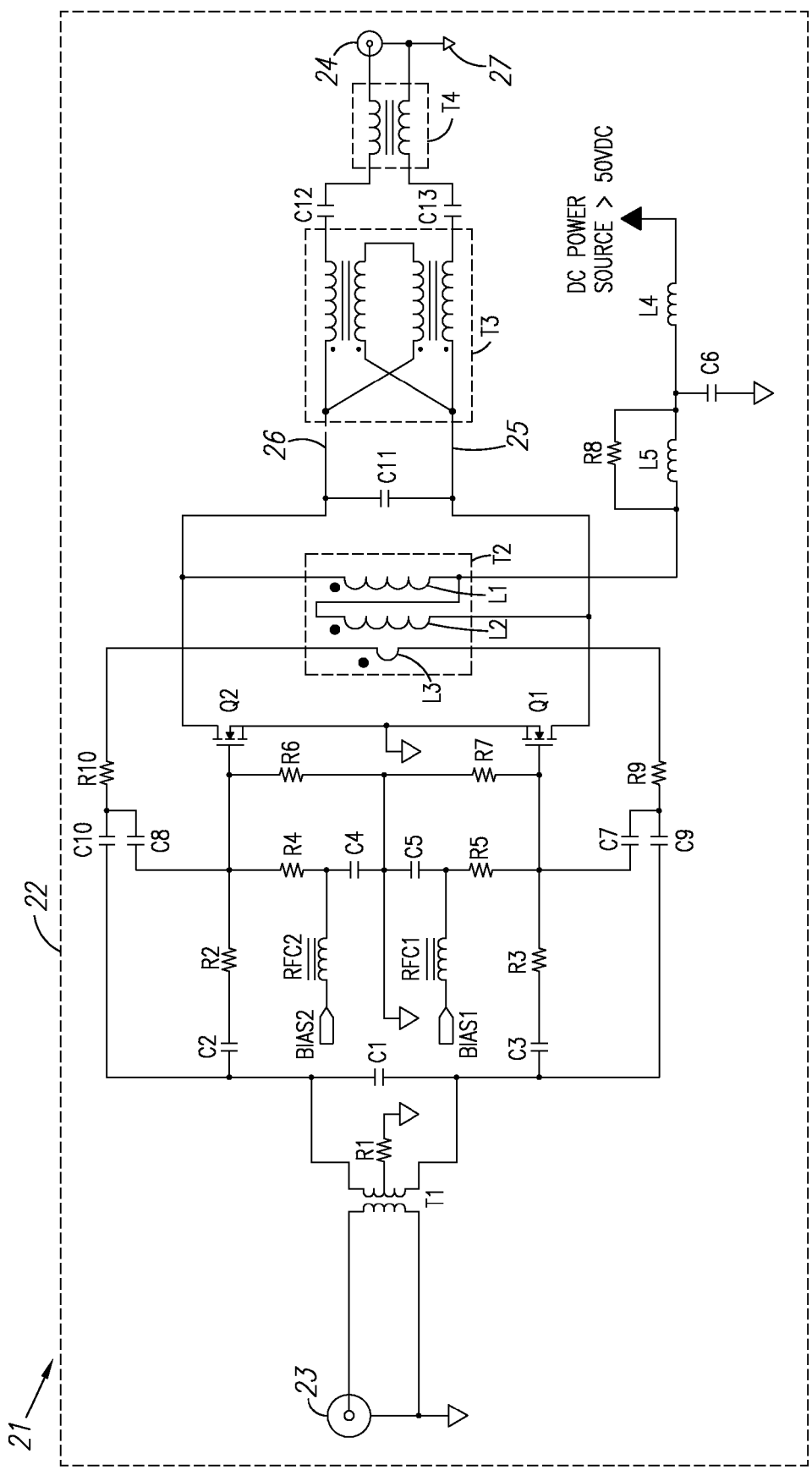
FIG. 2 is a schematic circuit diagram of an RF power amplifier module.
Figure 3:
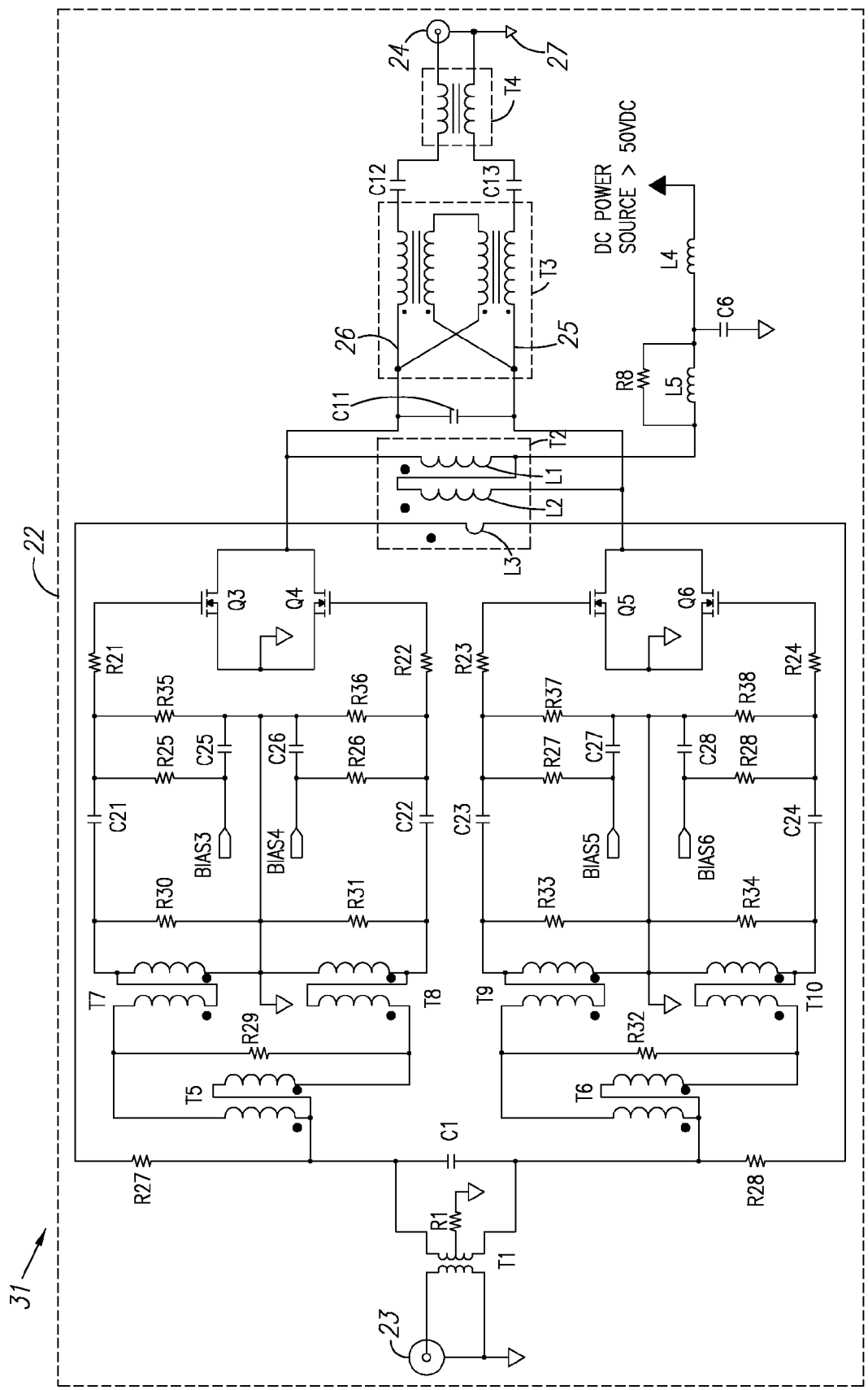
FIG. 3 is a schematic circuit diagram of an RF power amplifier module.

Example power amplifier modules 13a-13d are shown in FIGS. 2 and 3 and are discussed in detail below. In an embodiment, each power amplifier module 13a-13d is provided on a separate printed circuit board. In other embodiments, a plurality of amplifier modules are provided on one or more printed circuit boards.

Outputs from each of the power amplifier modules 13a-13d are provided to a combiner 14. In the example of FIG. 1, four power amplifier modules 13a-13d are provided and the combiner 14 combines the four outputs from the amplifier modules into a single, combined RF output. The combiner 14 is designed to combine as many signals as there are power amplifier modules. The combiner 14 can include a cascade of separate combiners for staged combining of the amplified signals into a combined signal. As shown in FIG. 1, the RF output from the combiner 14 is provided to the RF output terminal 11.

An RF power amplifier could comprise a single amplifier module, rather than a plurality of modules 13a-13d as shown in FIG. 1. An RF power amplifier having a single amplifier module would not require the splitter 12 and combiner 14.

FIG. 2 shows a push-pull power amplifier module 21. Transistors Q1 and Q2 form a push-pull pair for amplifying an RF signal.

The components that form the amplifier module 21 can be mounted on a printed circuit board 22. The amplifier module includes an RF input terminal 23 and an RF output terminal 24. In an embodiment, the characteristic impedance of the module's input and output terminals is 50 ohms. The terminals 23, 24 can be adapted for use with removable connectors, such as BNC or SMA connectors, for example.

An RF signal to be amplified by the amplifier module 21 is provided at the RF input terminal 23. The RF signal is transmitted to an input transformer T1. The transformer T1 has an unbalanced or single-ended side, which is connected to the RF input terminal 23. The unbalanced or single-ended side is coupled to a balanced or differential side of the transformer T1. The transformer T1 is shown as a so-called conventional transformer, having separated primary and secondary windings. It is to be appreciated that the transformer T1 could be constructed as a transmission line transformer, which does not have separated primary and secondary windings. An optional ground reference is provided for the transformer's balanced or differential side via a resistor R1. The transformer T1 has an input to output impedance ratio of 4:1, for example, and serves to divide the unbalanced RF signal into balanced signals, 180° out of phase, for amplification by the push-pull transistor pair Q1, Q2, and subsequent combination. It is to be appreciated that the transformer T1 could have an input to output impedance ratio of other than 4:1, such as 1:1.414, 1:9, 1:25, 3:2, etc. Further, it is to be appreciated that a so-called pi attenuator or pi input attenuator (not shown) comprising a plurality of resistors in a Greek letter "pi" configuration could be provided between the RF input terminal 23 and the transformer T1, for normalizing gain of the amplifier module 21. Other attenuators could be provided between the RF input terminal 23 and the transformer T1, such as an L attenuator or a T attenuator, for example.

The input transformer T1 is shown as an unbalanced-to-balanced transformer. However, it is to be appreciated that T1 could alternatively be a balanced-to-balanced transformer.

An optional compensation capacitor C1 is connected across the balanced terminals of the transformer T1 and provides a low-pass filter response which absorbs the inductance of T1 and helps compensate for a loss of gain at higher frequencies.

The transistors Q1, Q2 that form the push-pull pair are high-voltage MOSFET RF power transistors. The transistors Q1, Q2 have output power ratings of at least 150 watts, preferably at least 200 watts, and operate with a drain-to-source voltage that is greater than 50 VDC, such as 62 VDC, 72 VDC, 86 VDC, 96 VDC or 100 VDC, for example. Example transistors Q1, Q2 have output power ratings of 150 watts, 300 watts, and 750 watts. An example 150 watt transistor is model ARF520 manufactured by ADVANCED POWER TECHNOLOGY®. A further example 150 watt transistor is model SD3931 manufactured by STMICROELECTRONICS®. An example 300 watt transistor is model SD3933 manufactured by STMICROELECTRONICS®. An example 750 watt transistor is model ARF1500 manufactured by ADVANCED POWER TECHNOLOGY®. It is to be appreciated that transistors having output power ratings other than 150 watts, 300 watts, and 750 watts can be used in an amplifier module as shown in FIG. 2. For example, 200 watt transistors can be used in the amplifier module.

An amplifier module 21 as shown in FIG. 2, having 150 watt transistors Q1, Q2 forming a push-pull pair, can have a power rating of 300 watts. An amplifier module 21 having 300 watt transistors Q1, Q2 forming a push-pull pair, can have a power rating of 600 watts. An amplifier module 21 having 750 watt transistors Q1, Q2 forming a push-pull pair, can have a power rating of 1500 watts. It is to be appreciated that the power rating of the amplifier module depends on the power rating of the selected transistors and the drain-to-source voltage at which the transistors are operated. Further, it is to be appreciated that amplifier modules of various power ratings can be constructed.

The balanced signals from the transformer T1 are respectively provided to the gates of the transistors Q1, Q2. One balanced signal is provided to the gate of transistor Q2 through a coupling capacitor C2 and a resistor R2, for amplification by the transistor Q2. The other balanced signal is provided to the gate of transistor Q1 through a coupling capacitor C3 and resistor R3, for amplification by the transistor Q1. In an embodiment, capacitors C2 and C3 are each formed by two paralleled 47 nF capacitors and resistors R2 and R3 are each formed by four paralleled 15 ohm resistors.

A DC bias voltage for the gate of transistor Q2 is provided at BIAS2. The bias voltage is provided to the gate of transistor Q2 through an RF choke RFC2 and resistor R4. A capacitor C4 is connected to the RF choke RFC2 and resistor R4, and also to ground, and provides a low impedance path to ground for high frequency signals. In an embodiment, the RF choke RFC2 has a value of 10 μH. The DC bias voltage for the gate of transistor Q2 can be provided by a temperature compensating bias circuit.

Figure 4:
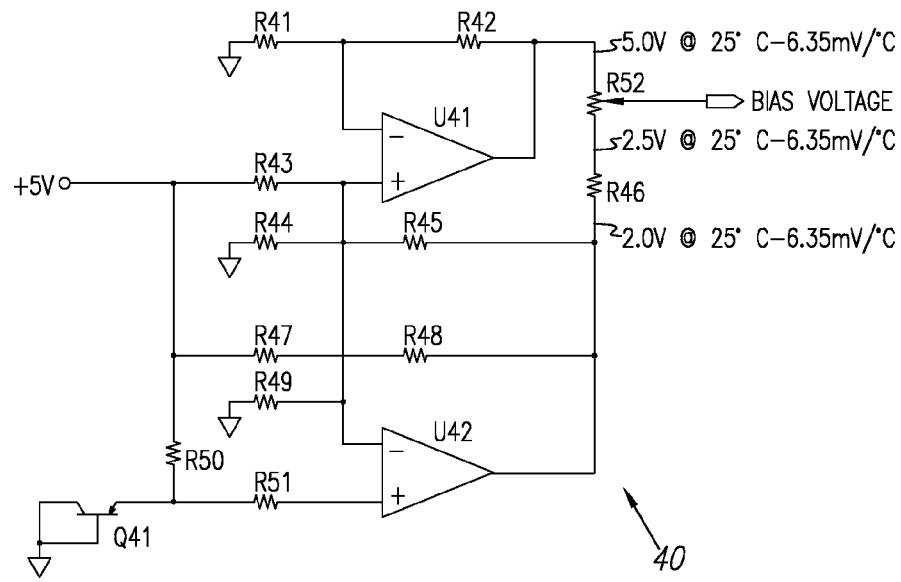
FIG. 4 is a schematic circuit diagram of temperature compensating bias circuitry for an RF power amplifier module.
Figure 5:
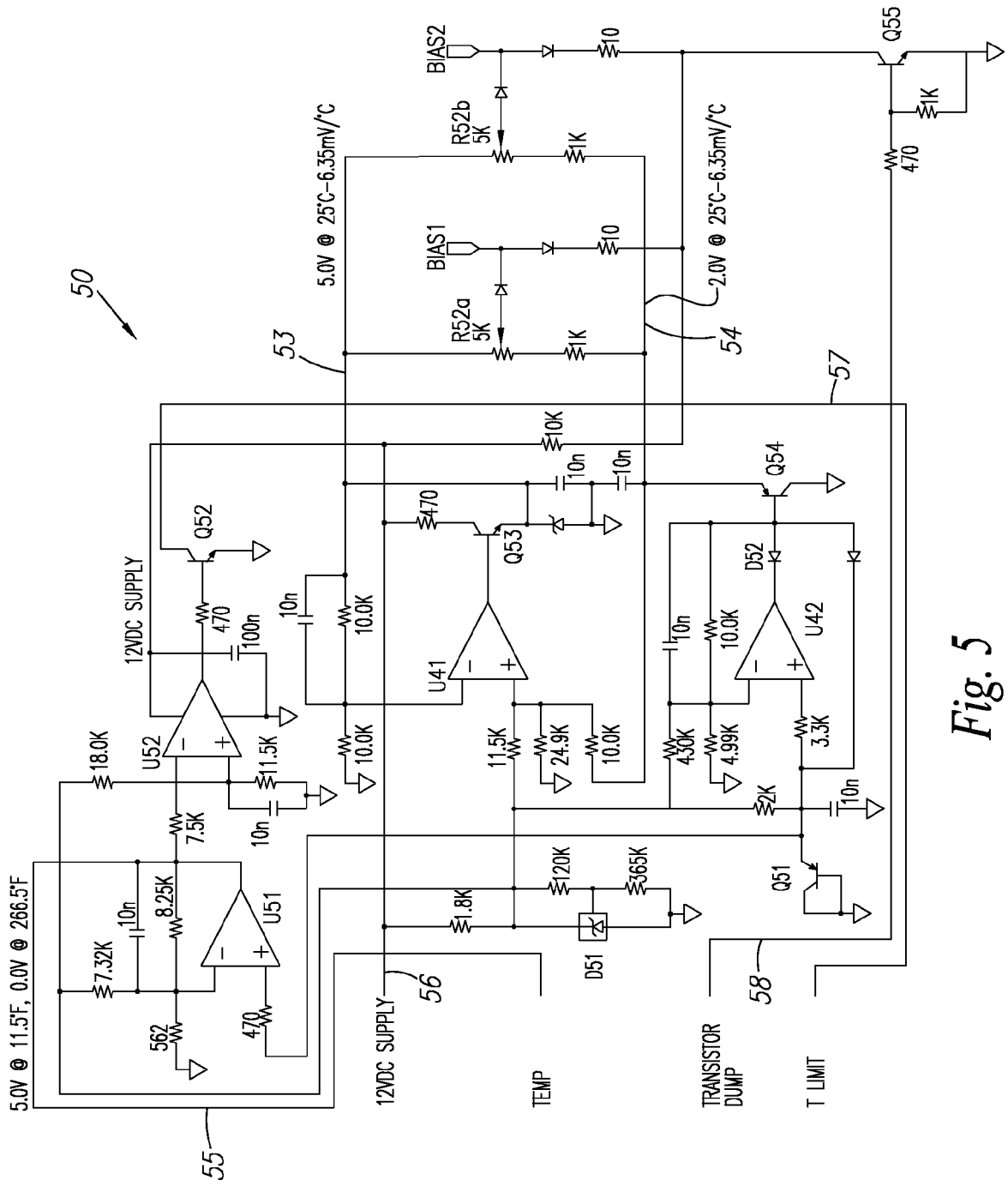
FIG. 5 is a schematic circuit diagram of temperature compensating bias circuitry for an RF power amplifier module.
Figure 9:
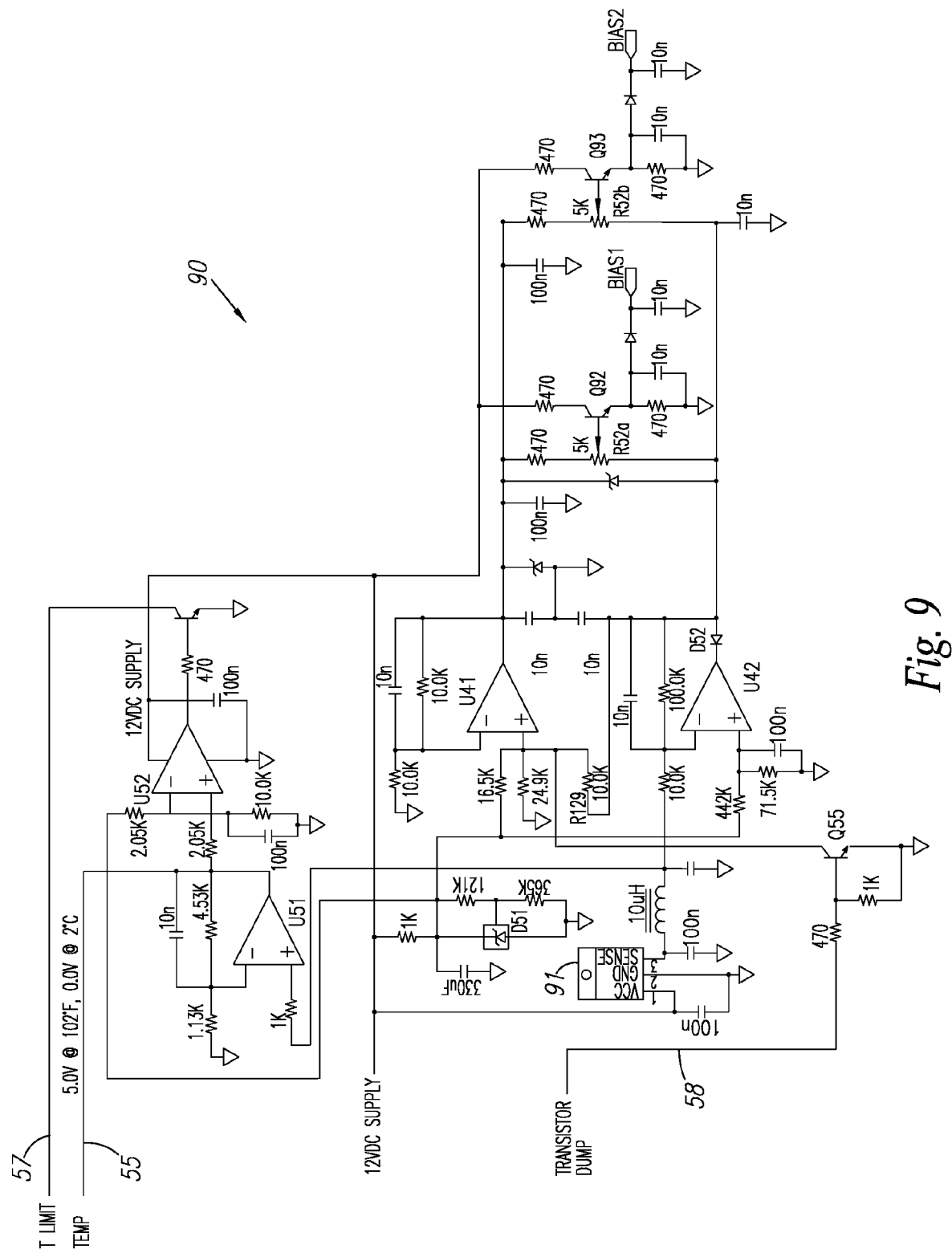
FIG. 9 is a schematic circuit diagram of temperature compensating bias circuitry for an RF power amplifier module.

Similarly, a DC bias voltage for the gate of transistor Q1 is provided at BIAS1. The DC bias voltage BIAS1 is provided to the gate of transistor Q1 through an RF choke RFC1 and resistor R5. A capacitor C5 is connected to the RF choke RFC1 and resistor R5, and also to ground. The capacitor C5 provides a low impedance path to ground for high frequency signals. In an embodiment, the RF choke RFC1 has a value of 10 μH. The DC bias voltage for the gate of transistor Q1 can be provided by a temperature compensating bias circuit. Temperature compensating bias circuits are shown in FIG. 4, FIG. 5 and FIG. 9 and are discussed further below.

In an embodiment, capacitors C4 and C5 are each formed by two paralleled 47 nF capacitors and resistors R4 and R5 are each formed by four paralleled 110 ohm resistors.

The gates of the transistors Q1, Q2 are respectively connected to ground through resistors R7 and R6, which provide a discharge path for the charge on the gates when DC bias is removed, and provide a solid ground reference for the DC bias voltages for the gates. The respective sources of transistors Q1 and Q2 are directly connected to ground. In an embodiment, resistors R6 and R7 each have a value of 10 kΩ.

As shown in FIG. 2, a DC power source that is greater than 50 VDC is connected to the drain of each transistor Q1, Q2 through a common mode choke T2. Coils L1 and L2 of the common mode choke T2 are connected such that magnetic flux is cancelled during each RF cycle, to minimize the net flux inside of the choke and, therefore, minimize the size of its core. A coil L3, which is an additional winding of the common mode choke, provides a negative feedback signal from the DC feed structure. Coil L3 can be provided by a single turn through the center of the core of the common mode choke T2. Negative feedback serves to lower the input impedance and to stabilize the amplifier's gain over its frequency range. A feedback path for the gate of transistor Q1 is provided through a network that includes resistor R9 and either capacitor C7 or optionally capacitor C9. A feedback path for the gate of transistor Q2 is provided through a network that includes resistor R10 and either capacitor C8 or optionally capacitor C10. In an embodiment, capacitors C7 and C8 are each formed by two paralleled 47 nF capacitors while capacitors C9 and C10 are not used, and resistors R9 and R10 are each formed by four paralleled 36 ohm resistors.

It is to be appreciated that coil L3 may be omitted and that negative feedback may be taken directly from the drains of the transistors Q1 and Q2. In such a configuration, the feedback resistors R9 and R10 will be made physically larger because the voltage at the drains is proportionally larger by the winding ratio of coil L3 to T2. More specifically, the voltage from coil L3 is proportional to the ratio of L3 turns divided by the sum of the turns of coils L1 and L2 times the RF drain-to-drain voltage applied to the primary low impedance side of transformer T3 (transformer T3 is discussed in detail below). For example if coil L3 is one turn and L1 and L2 are each eight turns, the voltage available from L3 is 1/16th of the drain-to-drain RF voltage.

The DC power source is connected to the common mode choke T2 through a network that includes inductors L4 and L5, a capacitor C6 and a resistor R8. The inductors L5 and L6 provide a high impedance to RF signals and a short circuit for the DC power source. RF signals are decoupled from the DC power source by conduction to ground through the resistor R8 and the capacitor C6. Inductors L4 and L5 can be ferrite bead inductors. In an embodiment, inductor L5 is a wound ferrite core with a value of 10 μH, and capacitor C6 is formed by six paralleled 47 nF capacitors. In addition to capacitor C6, similar grounded capacitors can be provided between inductor L4 and the DC power source, and between inductor L5 and the common mode choke T2. If, in addition to capacitor C6, similar grounded capacitors are provided between inductor L5 and common mode choke T2, then resistor R8 can be omitted. Sometimes, in an effort to increase isolation between the drains, the common DC feed point terminal of the common mode choke T2 is split, and each winding is fed by identical decoupling networks similar to inductor L5, resistor R8, capacitor C6, and inductor L4. In such a configuration, the resistors need to be twice the value of resistor R8 because they are AC paralleled. If in addition to capacitor C6 similar grounded capacitors are used at the DC feed terminals of the common mode choke T2, the resistors can be omitted.

A broadband transmission line output transformer T3 is connected to the drain of each transistor Q1, Q2 and combines the amplified RF signals from each transistor Q1, Q2. The transformer T3 is a balanced-to-balanced transformer having respective balanced inputs 25, 26 connected to the drains of the transistors Q1, Q2. In FIG. 2, balanced input 25 is directly connected to the drain of transistor Q1, and balanced input 26 is directly connected to the drain of transistor Q2. However, it is to be appreciated that DC-blocking capacitors could be provided between the balanced inputs 25, 26 and the drains of the transistors Q1, Q2. The transformer T3 has an input to output impedance ratio of 1:4 and performs an impedance matching function. In an embodiment, the characteristic impedance of the transistor output circuitry is 12.5 ohms. The transformer T3 combines the outputs from the transistors Q1, Q2 and steps the characteristic impedance of the circuit up to 50 ohms.

Transformer T3 can be constructed using suitable cores, for example, toroid or ferrite tube cores, and coaxial cables having a characteristic impedance of approximately or exactly 25 ohms. Each coaxial cable can be wound on its own core. 25 ohms is the geometric mean of a 12.5 ohm input and a 50 ohm output. Performance of the transformer T3 is enhanced when the characteristic impedance of the transformer's cables is the geometric mean of the input and output impedances. In an embodiment, the transformer T3 includes coaxial cables having a characteristic impedance of 25 ohms, a size 16 AWG stranded center conductor, TEFLON® insulation between an outer braid and the center conductor, and an insulating jacket. The 25 ohm transmission line used to construct the transformer T3 can also be constructed by paralleling standard 50 ohm coaxial cable. Further, the transmission line used to construct the transformer T3 may be constructed from parallel magnet wire or parallel twisted TEFLON®-insulated wire.

As stated above, the transformer T3 is a balanced-to-balanced transformer. There is essentially zero net flux within the cores of the transformer T3 because the currents in its transmission lines travel in opposite directions, which gives rise to identical fluxes of opposite sense. It is to be appreciated that in a balanced-to-unbalanced or unbalanced-to-unbalanced transformer, the flux cancellation is not as complete. Therefore, the cores of the transformer T3 can be made smaller than those used in a balanced-to-unbalanced or unbalanced-to-unbalanced transformer. Smaller transformer cores allow for shorter windings, thereby increasing the high frequency response of the transformer T3. Also, smaller transformer cores can accommodate a greater number or windings, resulting in increased inductance, which extends the lower frequency range of the transformer, such as to 1 MHz for example. In an embodiment, transformer T3 has an operating frequency range of 1-60 MHz.

One benefit of using a 1:4 impedance ratio transmission line transformer as an RF output transformer, as shown in FIG. 2, is that such a transformer is less difficult to construct than other transformers. A transformer having a 1:4 impedance ratio has an integer turns ratio of 1:2 and, therefore, does not require a winding tap. Such a transformer is less difficult to construct than a transformer having an impedance ratio of 1:2, which has a non-integer turns ratio of 1:1.414. However, in order to utilize a 1:4 impedance ratio transformer as an RF output transformer in a 600 watt push-pull amplifier module, transistors that operate with a drain-to-source voltage that is greater than 50 VDC must be used, rather than conventional 50 VDC MOSFETs.

An optional compensation capacitor C11 is connected across the balanced input terminals 25, 26 of the transformer T3, and provides a low-pass filter response by absorbing the inductance of T3 and any output capacitance of the transistors Q1, Q2. This helps compensate for gain slope reduction at the high end of the amplifier module's frequency range.

The balanced outputs of transformer T3 are connected to an optional output balun transformer T4 through DC-blocking capacitors C12, C13. Capacitor C12 is connected between one output of transformer T3 and one input of balun transformer T4. Capacitor C13 is connected between the other output of transformer T3 and the other input of balun transformer T4. The capacitors C12, C13 and balun transformer T4 are connected in series between transformer T3 and the RF output terminal 24. In the embodiment of FIG. 2, the capacitors C12, C13 are located at the output, 50 ohms side of transformer T3, and between transformer T3 and balun transformer T4. By locating the DC-blocking capacitors at the output, 50 ohms side of transformer T3, rather than at the input side, the capacitors C12, C13 can be designed to handle a lower current. Such capacitors may be less expensive than capacitors designed to handle a higher current. The optional output balun transformer T4 has an impedance ratio of 1:1 and is connected to RF output terminal 24. In an embodiment, the output balun transformer T4 is constructed using 50 ohm coaxial cable and a ferrite core. Alternatively, transformer T4 may be formed by paralleled magnet wire or by parallel or twisted TEFLON®-insulated wire. By locating the DC-blocking capacitors C12, C13 between transformers T3 and T4, the RF output terminal 24 can be directly connected to the output balun transformer T4 and installed directly on a ground plane 27 of the printed circuit board 22. It is to be appreciated that the output balun transformer T4 is optional and can be omitted in some applications. However, omitting the output balun transformer T4 may result in reduced efficiency and/or increased intermodulation distortion (IMD).

A further schematic view of the broadband output transformer T3, the DC-blocking capacitors C12, C13, and the output balun transformer T4 is provided at FIG. 2a. In FIG. 2a, the broadband output transformer T3 and output balun transformer T4 are schematically shown as comprising coaxial cables. The output balun transformer T4 is shown having a coaxial cable shield connected to ground and a coaxial cable center conductor connected to the RF output terminal 24. It is to be appreciated that the output balun transformer T4 can be reversely connected, so that the coaxial cable shield is connected to the RF output terminal 24 and the coaxial cable center conductor connected to ground. The high impedance output side of the broadband output transformer T3 is connected the output balun transformer T4 through the DC-blocking capacitors C12, C13. In FIG. 2a, at the high impedance output side of transformer T3, the coaxial cable center conductors are shown as directly connected together, and the coaxial cable shields are connected to respective DC-blocking capacitors C12, C13. It is to be appreciated that the high impedance output side of transformer T3 can be reversely connected, so that its coaxial cable shields are directly connected together, and the coaxial cable center conductors are connected to respective DC-blocking capacitors C12, C13.

In an embodiment, capacitors C12 and C13 are each formed by six paralleled 47 nF capacitors.

FIG. 3 shows another embodiment of a push-pull amplifier module 31. Various components shown in FIG. 3 are discussed above with respect to FIG. 2. Such components are referenced in FIG. 3 by identical reference characters as used in FIG. 2 and are not discussed in detail below.

A plurality of transistors having grounded sources and directly interconnected drains form each half of the push-pull amplifier. For example, two transistors Q3, Q4 form the "push" half of the amplifier and two transistors Q5, Q6 form the "pull" half of the amplifier. The transistors Q3-Q6 can have output power ratings of at least 100 watts and operate with a drain-to-source voltage that is greater than 50 VDC. An example 100 watt transistor is model ARF463 manufactured by ADVANCED POWER TECHNOLOGY®. An amplifier module 31, having four 100 W transistors Q3-Q6 can have a power rating of 400 W. An amplifier module 31 having four 150 watt transistors Q3-Q6 can have a power rating of 600 watts. An amplifier module 31 having four 300 watt transistors Q3-Q6 can have a power rating of 1200 watts. In additional embodiments, each half of the push-pull amplifier includes more than two transistors. It is to be appreciated that amplifier modules of various power ratings can be constructed, based on the power rating of the selected transistors, the drain-to-source voltage at which the transistors are operated, and the number of transistors provided in each half of the push-pull amplifier.

An RF signal to be amplified by the amplifier module 31 is provided at the RF input terminal 23. The RF signal is transmitted to the transformer T1 and split into balanced RF signals at the output of transformer T1.

The balanced RF signals from transformer T1 are respectively provided to transformers T5 and T6. Transformers T5 and T6 are so-called Type 1 Splitters, which further split the RF signals. The respective split signals from transformer T5 are provided to transformers T7 and T8, which are impedance matching transformers having an input-to-output impedance ratio of, for example, 1:4. The RF signal that is output from impedance matching transformer T7 is provided to the gate of transistor Q3 through DC-blocking capacitor C21 and resistor R21. Similarly, the RF signal that is output from impedance matching transformer T8 is provided to the gate of transistor Q4 through DC-blocking capacitor C22 and resistor R22. In an embodiment, the DC-blocking capacitors C21 and C22 are each formed by two paralleled 47 nF capacitors.

The respective split signals from transformer T6 are provided to impedance matching transformers T9 and T10. The RF signal that is output from impedance matching transformer T9 is provided to the gate of transistor Q5 through DC-blocking capacitor C23 and resistor R23. Similarly, the RF signal that is output from impedance matching transformer T10 is provided to the gate of transistor Q6 through DC-blocking capacitor C24 and resistor R24. In an embodiment, the DC-blocking capacitors C23 and C24 are each formed by two paralleled 47 nF capacitors.

It is to be appreciated that a splitter utilizing resistors for further splitting the RF signals from transformer T1 could be used, rather than a Type 1 Splitter and impedance matching transformers as shown in FIG. 3.

A DC bias voltage for the gate of transistor Q3 is provided at BIAS3 and through a resistor R25, for example, a 15Ω resistor. A capacitor C25, for example, a 47 nF capacitor, provides a low impedance path to ground for high frequency signals. A DC bias voltage for the gate of transistor Q4 is provided at BIAS4 and through a resistor R26, for example, a 15Ω resistor. A capacitor C26, for example, a 47 nF capacitor, provides a low impedance path to ground for high frequency signals. A DC bias voltage for the gate of transistor Q5 is provided at BIAS5 and through a resistor R27, for example, a 15Ω resistor. A capacitor C27, for example, a 47 nF capacitor, provides a low impedance path to ground for high frequency signals. A DC bias voltage for the gate of transistor Q6 is provided at BIAS6 and through a resistor R28, for example, a 15Ω resistor. A capacitor C28, for example, a 47 nF capacitor, provides a low impedance path to ground for high frequency signals.

Feedback signals are provided from the common mode choke T2 via coil L3 through resistors R27 and R28. It is to be appreciated that negative feedback could be taken directly from the drains of the transistors Q3-Q6, which would require physically larger dissipation resistors R27, R28. In an embodiment, resistors R27 and R28 are each formed by two paralleled 430 ohm resistors.

Resistors R29-R34 are balancing resistors for absorbing amplitude imbalance between the signal splitter outputs due to production tolerances. The resistors R29-R34 also help to maintain correct input port impedance, contributing to a low voltage standing wave ratio (VSWR). In an embodiment, resistors R29 and R32 are each formed by two paralleled 51 ohm resistors, and resistors R30, R31, R33, and R34 are each formed by two paralleled 15 ohm resistors.

Resistors R35-R38 provide discharge paths for the charge on the gates when DC bias is removed, and provide solid ground references for the DC bias voltages for the gates. In an embodiment, resistors R35-R38 each have a value of 10 kΩ.

The drains of transistors Q3 and Q4 are interconnected or directly connected together and are directly connected to an input 26 of transformer T3. The drains of transistors Q5 and Q6 are also interconnected or directly connected together and are directly connected to an input 25 of transformer T3. The "push" signal from transistors Q3 and Q4 are combined with the "pull" signal from transistors Q5 and Q6 by transformer T3.

FIG. 4 shows temperature compensating bias circuitry 40 for DC biasing the transistors that form the push-pull amplifiers discussed herein. In the amplifier shown in FIG. 2, the DC bias voltage from the temperature compensating bias circuitry 40 would be provided at BIAS1 and BIAS2. In the amplifier shown in FIG. 3, the DC bias voltage from the temperature compensating bias circuitry 40 would be provided at BIAS3 through BIAS6.

The temperature of the transistors in the push-pull amplifiers will increase during operation of the amplifiers. To maintain a linear transistor operation at a constant idle point (bias current level), the temperature compensating bias circuitry 40 reduces the bias voltage of the transistors as their temperature increases. In an embodiment, the temperature compensating bias circuitry 40 is designed to reduce the bias voltage at a rate of 6.35 mV/° C.

The temperature compensating bias circuitry 40 includes a temperature sensor Q41. The output of the temperature sensor Q41 changes with temperature. The temperature sensor Q41 can be mounted so as to sense the temperature of the transistors in the push-pull amplifier. For example, the temperature sensor Q41 can be attached to a heat sink for the transistors. In FIG. 4, the temperature sensor Q41 is a transistor and the temperature sensor provides a decreasing temperature signal level (e.g., −2.1 mV/° C.) as temperature increases. Alternatively, the temperature sensor could provide an increasing temperature signal level (e.g., 10 mV/° C.) as temperature increases. An example temperature sensor is a TIP31C power transistor. Another example temperature sensor is a temperature sensor integrated circuit (IC), such as an LM35 sensor from NATIONAL SEMICONDUCTOR®. It is to be appreciated that other types of temperature sensors could be incorporated into the temperature compensating bias circuitry 40, such as resistive temperature devices (RTDs) or thermistors for example, and that the temperature compensating bias circuitry can include a plurality of temperature sensors mounted at different locations on or around the push-pull amplifier.

The temperature compensating bias circuitry 40 further includes a first amplifier U41, a second amplifier U42, a plurality of resistors R41-R51, and a potentiometer R52. The first and second amplifiers U41, U42 can be operational amplifiers, such as the LM324A op-amp. The wiper of the potentiometer R52 provides a bias output to supply the temperature compensated DC bias voltage to the transistors of the push-pull amplifier (not shown in FIG. 4). In an embodiment, the potentiometer R52 is a 5 kΩ potentiometer. Multiple potentiometers can be paralleled to provide individual bias control to each transistor in the push-pull amplifier. The first amplifier U41 is configured to provide a first temperature dependent voltage to the potentiometer R52 based on the temperature signal from the temperature sensor Q41. The second amplifier U42 is configured to provide a second temperature dependent voltage based on the temperature signal to the potentiometer R52 through resistor R46. The first temperature dependent voltage and the second temperature dependent voltage change at substantially the same rate in response to the temperature signal. For example, both of the first temperature dependent voltage and the second temperature dependent voltage decrease at a rate of 6.35 mV/° C. Although the outputs of the amplifiers U41, U42 change with increasing temperature, the voltage across the potentiometer remains substantially constant, which allows the full 6.35 mV/° C. voltage reduction to be provided, at any physical setting of the potentiometer, as reduced bias voltage to the push-pull amplifier's transistors (rather than a voltage divided percentage of 6.35 mV/° C. as established by the wiper setting of the potentiometer R52). An example first temperature dependent voltage from the first amplifier U41 is 5.0 volts at 25° C. minus 6.35 mV/° C. An example second temperature dependent voltage from the second amplifier U42 is 2.0 volts at 25° C. minus 6.35 mV/° C.

An example value for resistors R41, R42, R45 and R48 is 10.0 kΩ. An example value for resistor R43 is 16.6 kΩ. An example value for resistor R44 is 24.9 kΩ. An example value for resistor R46 is 1 kΩ. An example value for resistor R47 is 430 kΩ. An example value for resistor R49 is 4.99 kΩ. An example value for resistor R50 is 2 kΩ. An example value for resistor R51 is 3.3 kΩ. A 5V input is shown as provided to resistors R43, R47 and R50. The 5V input can be a programmable reference voltage and is not limited to 5V. In an embodiment, the 5V input is provided by an adjustable precision voltage reference, such as an LM385 available from NATIONAL SEMICONDUCTOR®.

FIG. 5 shows a further example of temperature compensating bias circuitry 50 for DC biasing the transistors that form the push-pull amplifiers discussed herein. The bias circuitry 50 includes an adjustable precision voltage reference D51 and a temperature sensor Q51. With a 12 VDC supply 56 as shown, the bias circuitry is configured to supply a substantially constant 2.5 VDC across potentiometers R52a and R52b, while the first temperature dependent voltage 53 is 5.0 volts at 25° C. minus 6.35 mV/° C. and the second temperature voltage 54 is 2.0 volts at 25° C. minus 6.35 mV/° C. Supply 56 voltages other than 12 VDC (e.g., 8 VDC) could be used by the bias circuitry 50. The bias circuitry 50 includes two bias outputs BIAS1, BIAS2 for supplying the temperature compensated DC bias voltage to the transistors of the push-pull amplifier (not shown in FIG. 5). Example component values for resistors and capacitors in the bias circuitry 50 are shown in the figure. In FIG. 5, amplifiers U41 and U42 feed transistors Q53 and Q54, respectively, rather than feeding the potentiometers R52a and R52b directly. Transistors Q53 and Q54 are configured as followers and allow the amplifiers U41 and U42 to supply the necessary current when multiple potentiometers are used. An optional diode D52 is provided at the output of amplifier U42 to compensate for any ambient temperature-induced changes in the operation of the transistors Q53 and Q54. Multiple diodes can be used instead of a single diode D52 as shown, to compensate for ambient temperature-induced changes in the operation of other components, such as changes in the operation of the diodes located between the potentiometers R52a, R52b and the bias outputs BIAS1, BIAS2.

The temperature compensating bias circuitry 50 of FIG. 5 includes an amplifier U51 that generates a temperature output signal 55. The temperature output signal 55 transmits the temperature of the RF power amplifier module and can be monitored by a remote device and/or used to display a current temperature of the RF power amplifier module. The bias circuitry 50 can be configured so that the temperature output signal 55 increases at a constant rate, such as 50 mV/° C., or decreases at a constant rate over a voltage range (e.g., 0-5 VDC) corresponding to a temperature range (e.g., 2° C.-102° C.). The bias circuitry 50 can further be configured so that the temperature output signal 55 increases or decreases at a constant rate per bit of an analog to digital (A/D) converter (e.g., 1° F. per bit for an 8 bit ND). In FIG. 5, the temperature output signal 55 is configured to be 5 VDC at 11.5° F. and 0 VDC at 266.5° F., which is 1° F. per bit for an 8 bit ND. It is to be appreciated that the amplifier U51 can be configured to generate a positive going signal suitable for display on an analog meter.

The temperature compensating bias circuitry 50 of FIG. 5 further includes an amplifier U52 (e.g., an operational amplifier) configured as a comparator that controls activations of transistor Q52 based on the temperature signal from the temperature sensor Q51. When the temperature exceeds a set point or limit established by the voltage divider consisting of the 18K and 11.5K resistors, the comparator output causes the transistor Q52 to conduct. This generates a high temperature alarm on a T LIMIT line 57, to signal an off board controller (not shown) that a fault condition exists and that corrective action needs to be taken. A TRANSISTOR DUMP line 58 allows the off board controller to deactivate the transistors of the push-pull amplifier. The off board controller can deactivate the transistors of the push-pull amplifier based on monitored parameters, such as the temperature of the amplifier module. In the event of any fault, it is desirable for the RF transistors to stop amplifying as soon as possible. One way to do this is to shut the transistors off by removing bias and discharging the gates as soon as possible. Activation of a dump transistor Q55 pulls the gates of the push-pull amplifier to ground through 10Ω resistors, which limit the discharge current to a safe level that will not damage transistor Q55.

It is to be appreciated that the use of quad op-amp ICs in the temperature compensating bias circuitry 50 will provide amplifiers U41, U42, U51 and U52 in a single package. The marginal cost increase of a quad op-amp IC versus a dual op-amp IC is typically small. Therefore, although amplifiers U51 and U52 are optional elements of the temperature compensating bias circuitry 50, their addition should not increase the cost of the circuitry 50 very much, rendering the temperature output and the temperature alarm signals inexpensive to generate.

FIG. 9 shows a further example of temperature compensating bias circuitry 90 for DC biasing the transistors that form the push-pull amplifiers discussed herein. The bias circuitry 90 in FIG. 9 includes a temperature sensor IC 91 rather than using a transistor as a temperature sensor. The temperature sensor IC 91 provides an increasing temperature signal level as the temperature of the RF module increases (e.g., 10 mV/° C.). The bias circuitry 90 processes the increasing temperature signal level from the temperature sensor IC 91 to provide the DC bias outputs BIAS1 and BIAS2 for the transistors in the push-pull amplifiers (not shown), the temperature output signal 55, and the high temperature alarm 57. As compared to the bias circuitry 50 shown in FIG. 5, transistors Q53 and Q54 are omitted from the bias circuitry 90 shown in FIG. 9. However, the wipers of the potentiometers R52a, R52b are connected to transistors Q92 and Q93, which function as followers and generate the DC bias outputs BIAS1, BIAS2. The emitters of the follower transistors Q92, Q93 are grounded through a low value resistor to provide a low impedance source characteristic that provides low IMD. Further, in the bias circuitry 90 of FIG. 9, the dump transistor Q55 is connected to the "+" terminal of amplifier U41. When the dump transistor Q55 is activated by the TRANSISTOR DUMP line 58, it essentially forces amplifier U41 to reduce its output to 0V, causing the voltage at the bias outputs to drop to a very low value below the gate threshold voltage of the push-pull amplifier transistors. The gates of the RF MOSFETs in the push-pull amplifiers then discharge through gate resistors (e.g., see resistors R6 and R7 in FIG. 2). Because the transistor followers allow a very large amount of current to be applied to the RF transistor gate resistors, the gate resistors can be changed to a much lower value (example from 10 KΩ to 470Ω or even 100Ω) to decrease the discharge time of the RF transistor gates. The added benefit of the lower value gate resistor is an improvement in the IMD of the amplifier module.

Figure 6:
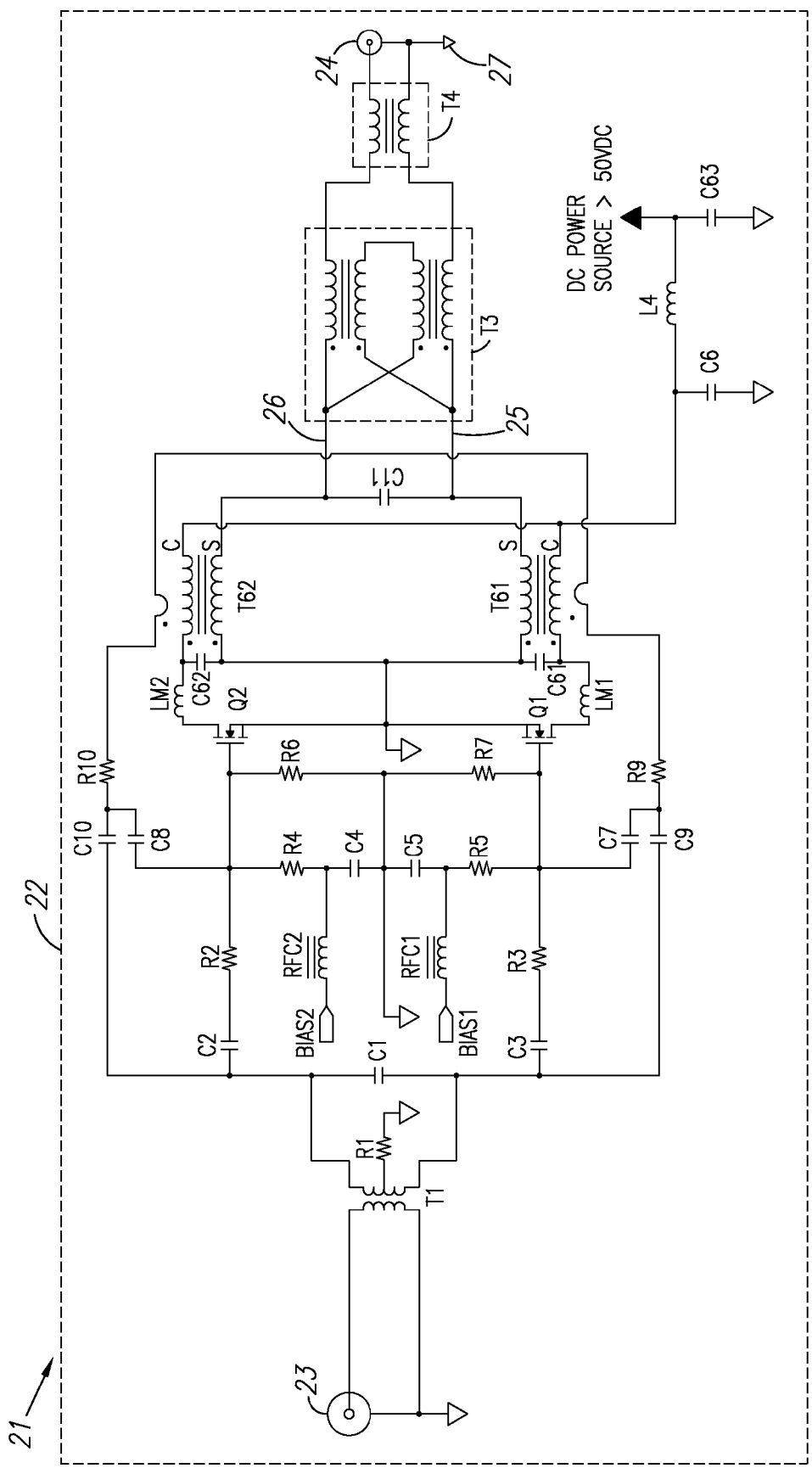
FIG. 6 is a schematic circuit diagram of an RF power amplifier module.
Figure 8:
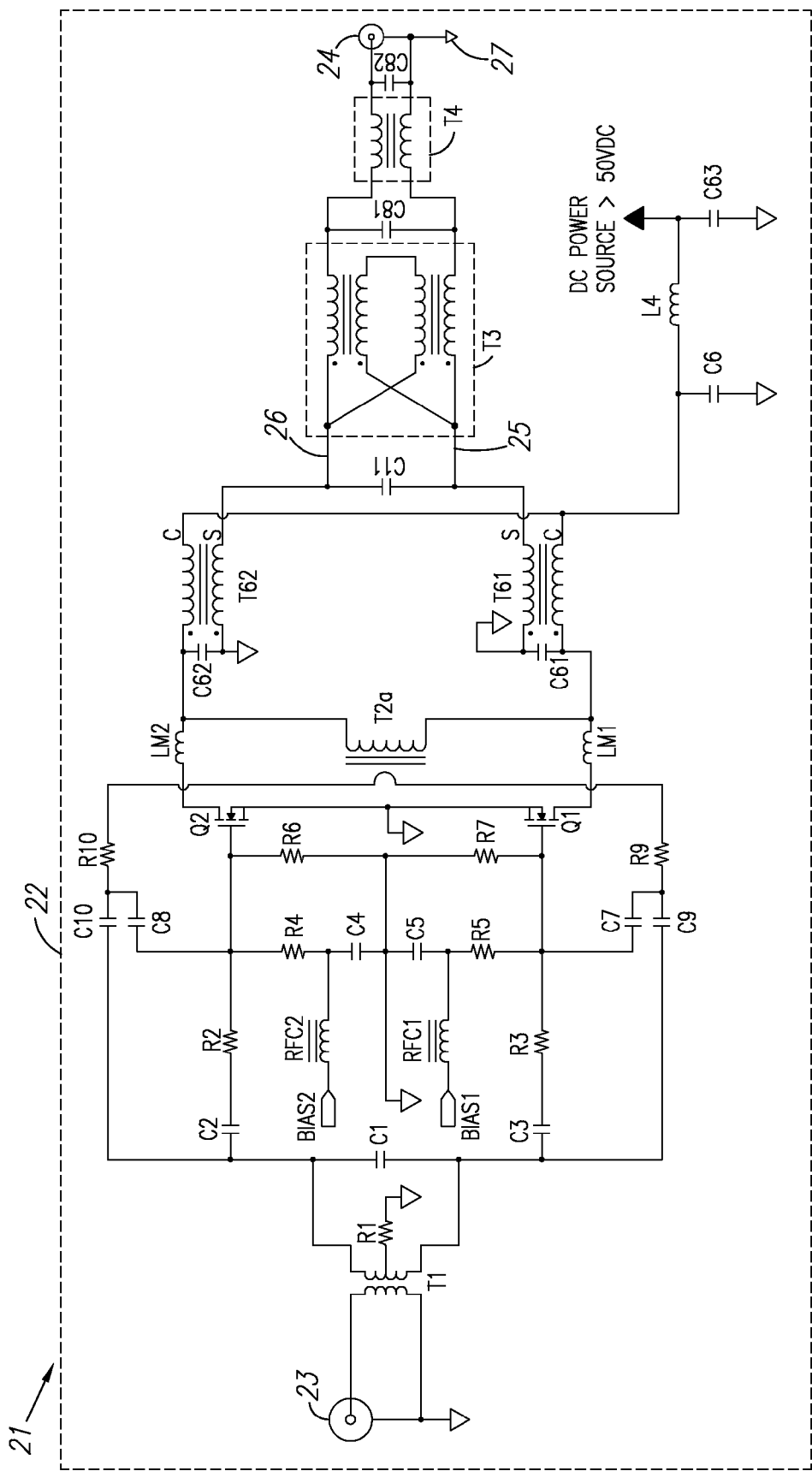
FIG. 8 is a schematic circuit diagram of an RF power amplifier module.

FIG. 6 and FIG. 8 show modifications of the push-pull power amplifier module 21 of FIG. 2. Various components shown in FIG. 6 and FIG. 8 are discussed above with respect to FIG. 2. Such components are referenced in FIG. 6 and FIG. 8 by identical reference characters as used in FIG. 2 and are not discussed in detail below.

In FIG. 6, the DC-blocking capacitors C12, C13 are replaced with DC-blocking transformers T61 and T62, and the common mode choke T2 is omitted. The DC-blocking capacitors C12, C13 can be a source of failure in the power amplifier module 21 when they are subject to very high RF currents. Performance and reliability of the power amplifier module 21 can be improved by using DC-blocking transformers rather than capacitors.

The DC-blocking transformers T61, T62 are respectively connected between the drains of transistors Q1 and Q2 and the balanced inputs 25, 26 of the broadband output transformer T3. A negative feedback signal from the DC feed structure is provided by the DC-blocking transformers T61, T62 as shown. The negative feedback can be provided by a single turn of wire through the centers of the cores of the DC-blocking transformers T61, T62. See FIG. 7, which provides a schematic diagram of the DC-blocking transformers T61, T62.

Optional matching coils LM1 and LM2 can be located between the DC-blocking transformers T61, T62 and the drains of the transistors Q1, Q2, and optional capacitors C61 and C62 can be located across the respective inputs of the DC-blocking transformers T61, T62. A bypass capacitor C63 can be located at the DC power source. Optional capacitor C6 provides further bypassing and can help improve balance of the system.

Figure 7:
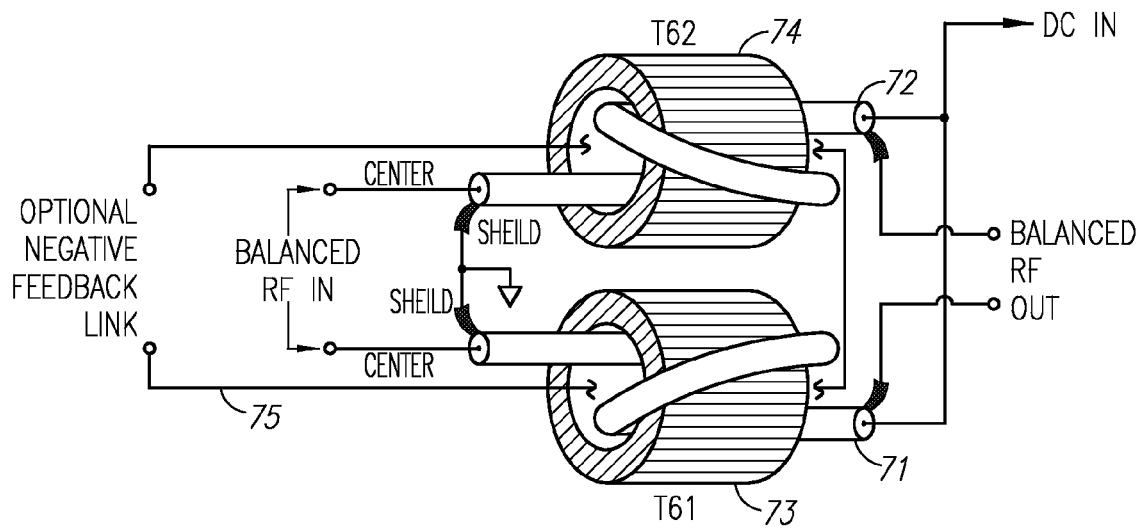
FIG. 7 is a schematic diagram of DC-blocking transformers for an RF power amplifier module.

FIG. 7 schematically shows the construction of the DC-blocking transformers T61, T62. The DC-blocking transformers can be formed by winding coaxial cables 71, 72 on respective cores 73, 74. In an embodiment, the coaxial cables have a characteristic impedance of 25 ohms, which is twice the drain-drain differential impedance of the transistors Q1, Q2. Connections to the center and shield conductors of the coaxial cables 71, 72 are shown in FIG. 7. The center and shield conductors are further identified in FIG. 6 by "C" and "S", respectively. The negative feedback loop 75 is also shown in FIG. 7. It is to be appreciated that the center and shield connections can be transposed, and that the construction is not limited to coaxial cable (e.g., twisted wire pairs, paralleled wire, etc. can also be used). It is to be further appreciated that power and current handling capability of said 25Ω cable can be greatly increased by constructing the 25Ω cable by paralleling two 50Ω cables, preferably connecting the shield of one to the center of the other.

The input side of the DC-blocking transformers T61, T62 is identified as "Balanced RF In" and the output side is identified as "Balanced RF Out." The shields of the coaxial cables 71, 72 are connected to ground at the input side and, at the output side, provide the Balanced RF Out. The center conductors are connected to the drains of the transistors Q1, Q2 through optional matching coils LM1, LM2 (see FIG. 6). The optional capacitors C61, C62 (see FIG. 6) are each connected between a center conductor and shield at the input side of the DC-blocking transformers T61, T62. The DC power source for the transistors Q1, Q2 is connected to the center conductors of the cables 71, 72 at the output side of the transformers T61, T62. The shields of the cables 71, 72 provide the RF output signal to the broadband output transformer T3 (see FIG. 6) at the output side of the transformers T61, T62.

It is to be appreciated that the DC-blocking transformers T61, T62 can be constructed from paralleled or twisted wire if desired.

FIG. 8 shows the push-pull power amplifier module 21 of FIG. 6 with the addition of transformer T2a. Transformer T2a generates the negative feedback signal for the transistors Q1, Q2, instead of the DC-blocking transformers T61, T62. Transformer T2a can be connected on either side of the optional matching coils LM1 and LM2. In an embodiment, the primary of transformer T2a is a single turn loop. Optional capacitors C81 and C82 are also shown connected on either side of the output balun transformer T4.

Figure 10:
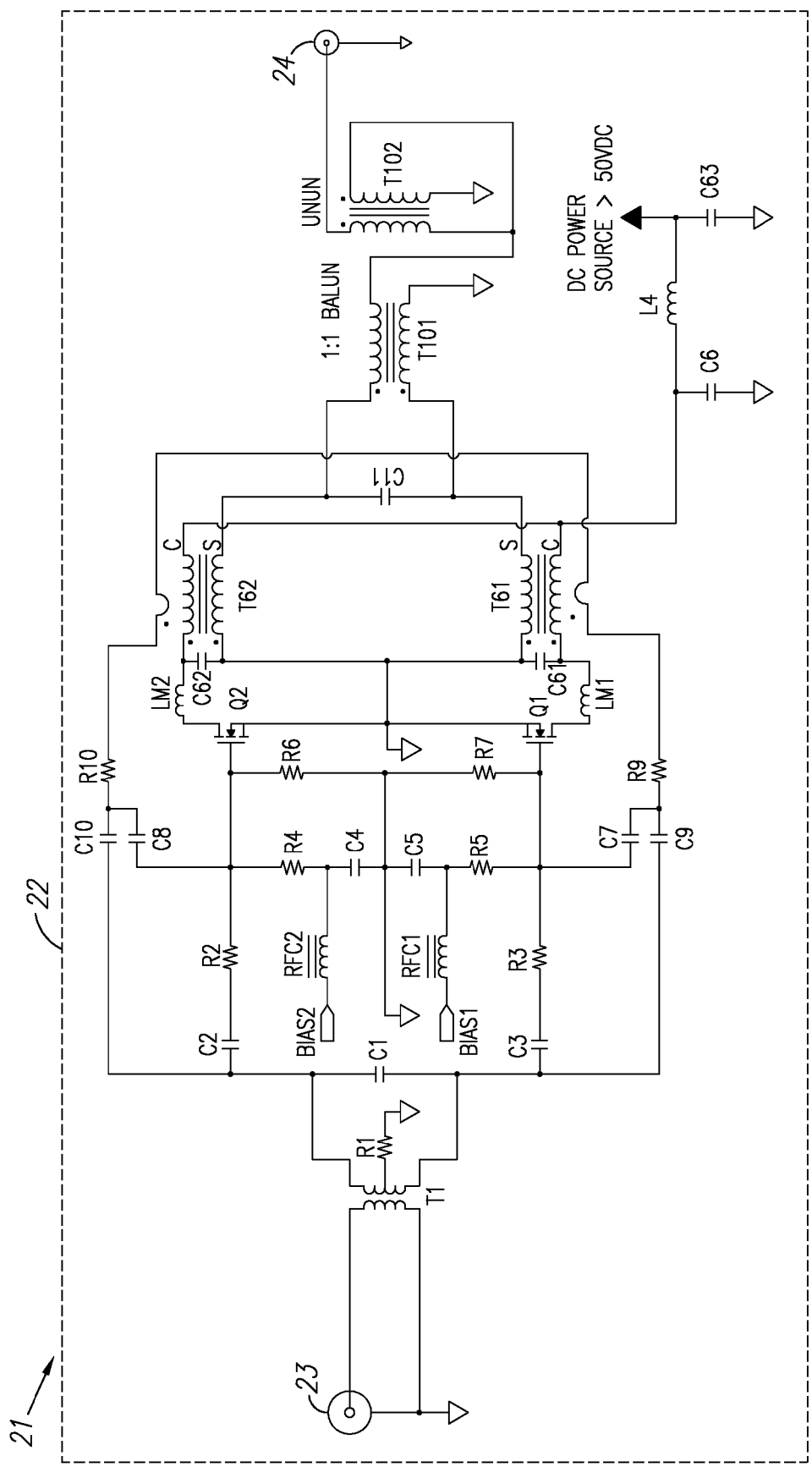
FIG. 10 is a schematic circuit diagram of an RF power amplifier module

In a configuration differing from FIG. 6, FIG. 10 shows the DC-blocking transformers connected to a 12.5 ohm characteristic impedance, 1:1 impedance ratio balun T101, followed by a 1:4 impedance ratio unbalanced-to-unbalanced transformer T102. The balun T101 is a broadband output transformer. Transformers T3 and T4 are eliminated in FIG. 10.

As discussed above, the amplifier modules described herein can be combined to create higher-powered amplifiers. It is to be appreciated that the combiners used to combine the outputs of the amplifier modules can have a variety of output impedances, such as 12.5 ohm, 25 ohm, 50 ohm, 100 ohm, etc. The output impedance of the combiners can further be matched to a desired characteristic impedance, such as 50 ohm, using a transformer that provides the proper impedance matching.

Figure 11:
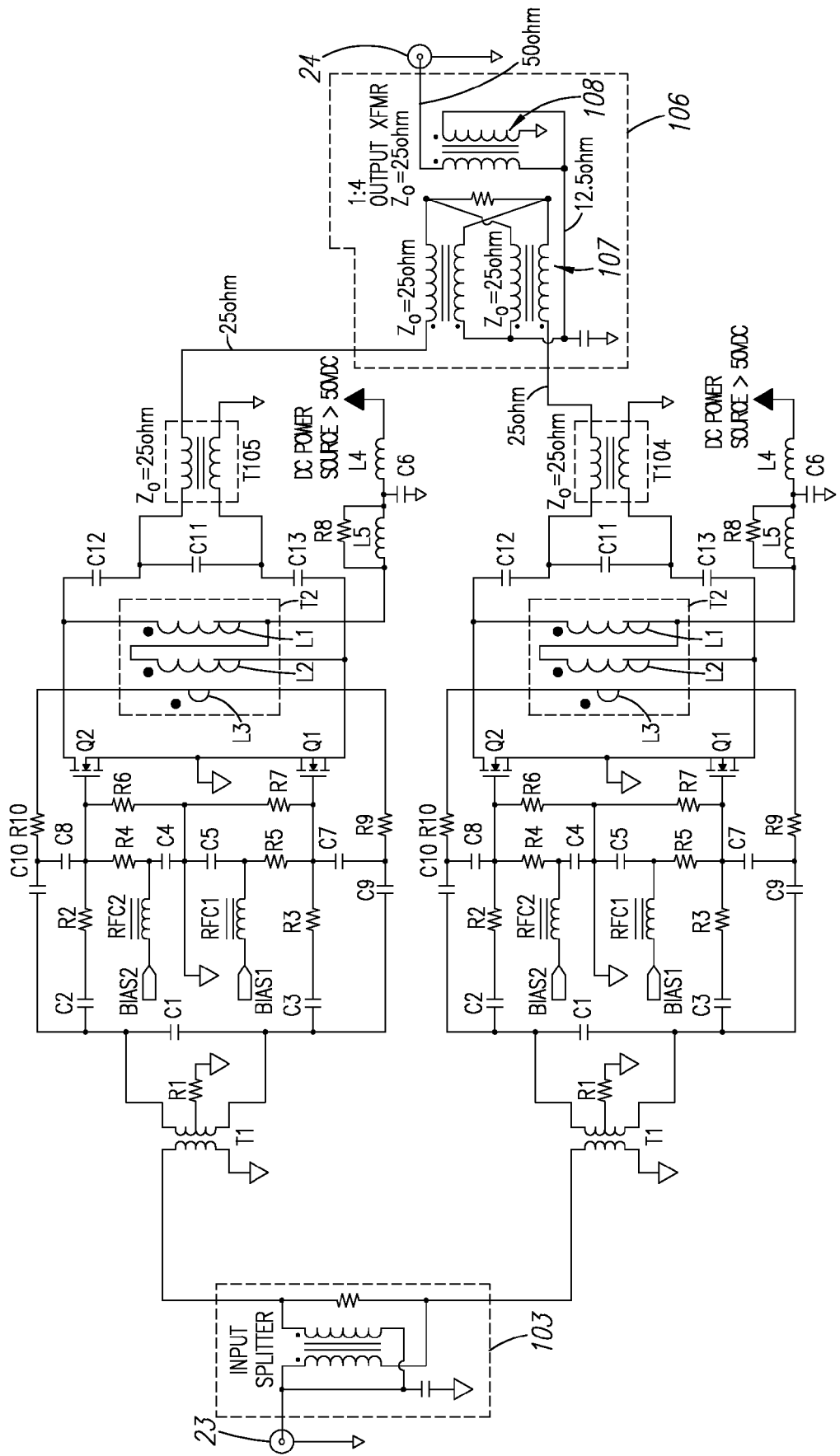
FIG. 11 is a schematic circuit diagram of an RF power amplifier.
Figure 12:
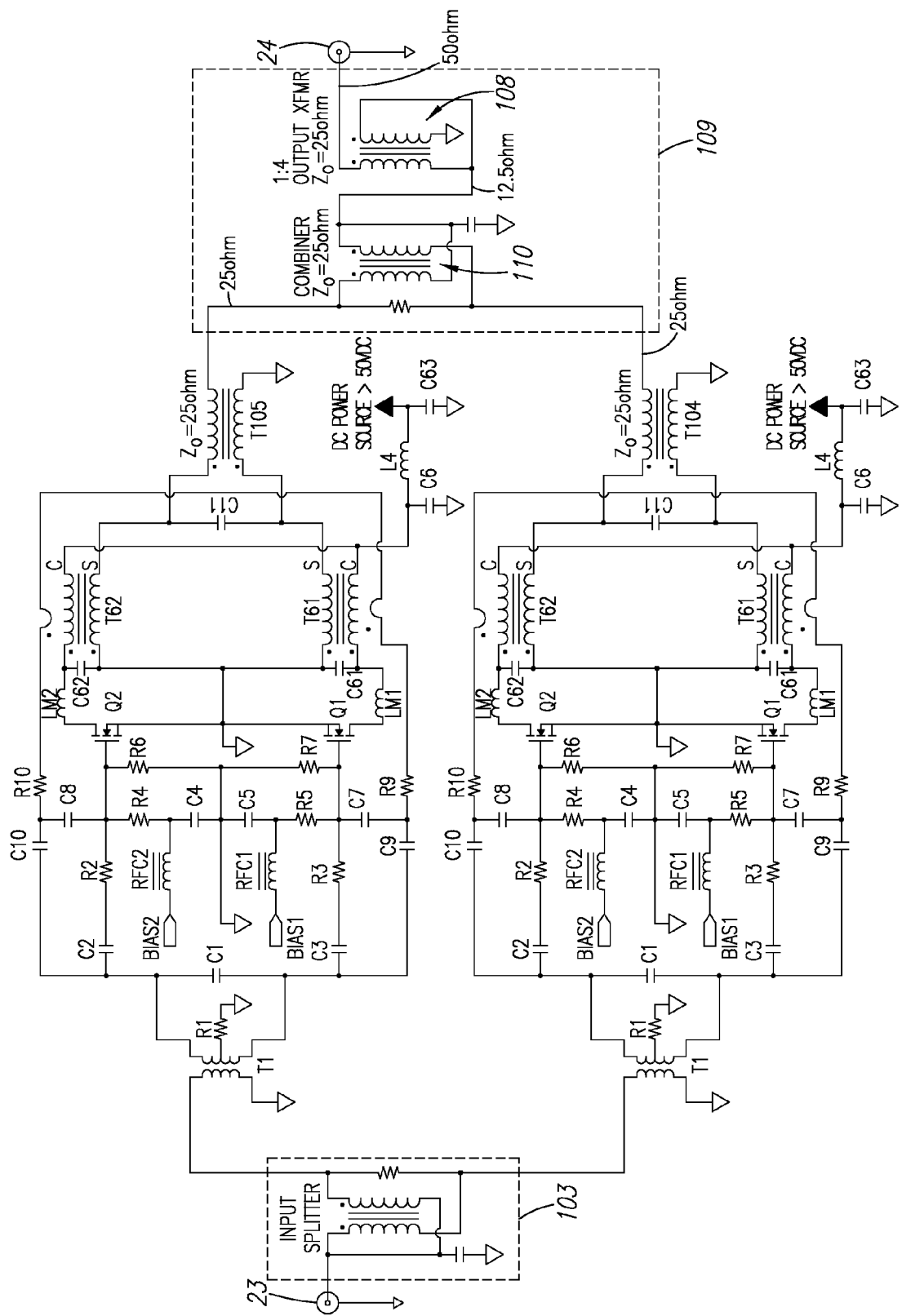
FIG. 12 is a schematic circuit diagram of an RF power amplifier.

FIG. 11 and FIG. 12 both show two amplifier modules being combined to create a higher-powered amplifier. A splitter 103 splits an input signal to two push-pull amplifier modules. The amplifier modules in FIG. 11 include DC-blocking capacitors C12, C13, whereas the amplifier modules in FIG. 12 include DC-blocking transformers T61, T62. In FIG. 11 and FIG. 12, the output of each push-pull transistor pair in a module is fed to an output balun transformer T104, T105. The output balun transformers T104, T105 can have an input-to-output impedance ratio of 1:1. The output balun transformers provide an output impedance of 25 ohms for each amplifier module. The output balun transformers T104, T105 in FIG. 11 supply a combiner 106. The combiner 106 combines the outputs from the amplifier modules into a combined signal. The combiner 106 includes a type 2 hybrid 0° 2-way combiner 107, which supplies an unbalanced-to-unbalanced output transformer 108 having an input-to-output impedance ratio of 1:4. The output impedance of the type 2 hybrid 0° 2-way combiner 107 is 12.5 ohms, which is stepped up to a 50 ohm output impedance by the unbalanced-to-unbalanced output transformer 108. The type 2 hybrid 0° 2-way combiner 107 supplies the combined signal to the unbalanced-to-unbalanced output transformer 108.

The combiner 109 in FIG. 12 is similar to the combiner in FIG. 11, except that the combiner 109 includes a type 1 0° hybrid combiner.

Example applications with which the disclosed modular RF power amplifier system may be used include radio communications, such as amateur radio communications, military radio communications, marine radio communications (e.g., ship to shore), high frequency radio telephone communications, and short wave radio broadcast stations.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. An RF power amplifier, comprising:
  a first field effect transistor:
    having a first gate, a first source, and a first drain,
    having an output power rating of at least 200 watts, and
    operating with a drain-to-source voltage that is greater than 50 VDC;
  a second field effect transistor:
    having a second gate, a second source, and a second drain,
    having an output power rating of at least 200 watts, and
    operating with a drain-to-source voltage that is greater than 50 VDC;
    wherein said transistors are configured as a push-pull amplifier;
  an RF signal input;
  an input transformer connected to the RF signal input, the input transformer having respective balanced outputs connected to the first gate and the second gate;
  a broadband output transformer having a first balanced input connected to the first drain, and a second balanced input connected to the second drain, wherein the broadband output transformer has an input to output impedance ratio of 1:4, and further wherein at least some flux cancellation occurs within the broadband output transformer; and
  temperature compensating bias circuitry for providing a temperature compensated bias voltage to the first field effect transistor and the second field effect transistor for decreasing the bias voltage of the first field effect transistor and the second field effect transistor as transistor temperature increases, the temperature compensating bias circuitry comprising:
    a temperature sensor generating a temperature signal;
    a first amplifier having an output providing a first temperature dependent voltage based on the temperature signal;
    a second amplifier having an output providing a second temperature dependent voltage based on the temperature signal, wherein the first temperature dependent voltage and the second temperature dependent voltage change at substantially the same rate in response to the temperature signal; and
    a potentiometer connected to the output of the first amplifier and the output of the second amplifier such that a voltage across the potentiometer remains substantially constant when the first temperature dependent voltage and the second temperature dependent voltage change; and
a bias output connected to at least one of the first field effect transistor and the second field effect transistor and supplying the temperature compensated bias voltage to the at least one of the first field effect transistor and the second field effect transistor.

2. A modular RF power amplifier system, comprising:
a first amplifier module comprising the RF power amplifier as set forth in claim 1; and
a second amplifier module comprising the RF power amplifier as set forth in claim 1;
wherein outputs from said modules are combined to form a combined RF output.

3. The RF power amplifier of claim 1, further comprising:
an RF output terminal;
an output balun transformer; and
a DC-blocking capacitor, wherein the output balun transformer and the DC-blocking capacitor are connected in series between the broadband output transformer and the RF output terminal,
wherein the broadband output transformer is a transmission line transformer including a cable having a characteristic impedance of approximately or exactly 25 ohms,
wherein the broadband output transformer has balanced outputs and during operation of the RF power amplifier a net flux within the broadband output transformer is substantially zero, and
wherein the output balun transformer has an input to output impedance ratio of 1:1 and a characteristic impedance of approximately or exactly 50 ohms.

4. An RF power amplifier, comprising:
a first plurality of field effect transistors having directly interconnected drains and respective output power ratings of at least 100 watts;
a second plurality of field effect transistors having directly interconnected drains and respective output power ratings of at least 100 watts;
wherein said transistors operate with a drain-to-source voltage that is greater than 50 VDC, and
wherein the first plurality of field effect transistors and the second plurality of field effect transistors together form a push-pull amplifier having an output power rating of at least 400 watts;
an RF signal input;
an input transformer connected to the RF signal input, the input transformer having respective balanced outputs connected to gates of the first plurality of field effect transistors and gates of the second plurality of field effect transistors; and
a broadband output transformer having a first balanced input connected to the drains of the first plurality of field effect transistors, and a second balanced input connected to the drains of the second plurality of field effect transistors, wherein the broadband output transformer has an input to output impedance ratio of 1:4, and further wherein at least some flux cancellation occurs within the broadband output transformer; and
temperature compensating bias circuitry for providing a temperature compensated bias voltage to the first plurality of field effect transistors and the second plurality of field effect transistors for decreasing the bias voltage of the first plurality of field effect transistors and the second plurality of field effect transistors as transistor temperature increases, the temperature compensating bias circuitry comprising:
a temperature sensor generating a temperature signal;
a first amplifier having an output providing a first temperature dependent voltage based on the temperature signal;
a second amplifier having an output providing a second temperature dependent voltage based on the temperature signal, wherein the first temperature dependent voltage and the second temperature dependent voltage change at substantially the same rate in response to the temperature signal; and
a potentiometer connected to the output of the first amplifier and the output of the second amplifier such that a voltage across the potentiometer remains substantially constant when the first temperature dependent voltage and the second temperature dependent voltage change; and
a bias output connected to at least one of the first plurality of field effect transistors and the second plurality of field effect transistors and supplying the temperature compensated bias voltage to the at least one of the first plurality of field effect transistors and the second plurality of field effect transistors.

5. A modular RF power amplifier system, comprising:
a first amplifier module comprising the RF power amplifier as set forth in claim 4; and
a second amplifier module comprising the RF power amplifier as set forth in claim 4, wherein outputs from said modules are combined to form a combined RF output.

6. The RF power amplifier of claim 4, further comprising:
an RF output terminal;
an output balun transformer; and
a DC-blocking capacitor, wherein the output balun transformer and the DC-blocking capacitor are connected in series between the broadband output transformer and the RF output terminal,
wherein the broadband output transformer is a transmission line transformer including a cable having a characteristic impedance of approximately or exactly 25 ohms,
wherein the broadband output transformer has balanced outputs and during operation of the RF power amplifier a net flux within the broadband output transformer is substantially zero, and
wherein the output balun transformer has an input to output impedance ratio of 1:1 and a characteristic impedance of approximately or exactly 50 ohms.

7. An RF power amplifier, comprising:
a push-pull amplifier, the push-pull amplifier comprising a first field effect transistor and a second field effect transistor; and
temperature compensating bias circuitry for providing a temperature compensated bias voltage to the first field effect transistor and the second field effect transistor for decreasing the bias voltage of the first field effect transistor and the second field effect transistor as transistor temperature increases, the temperature compensating bias circuitry comprising:
a temperature sensor generating a temperature signal;
a first amplifier having an output providing a first temperature dependent voltage based on the temperature signal; and
a potentiometer connected to the output of the first amplifier such that a voltage across the potentiometer remains substantially constant when the first temperature dependent voltage changes; and
a bias output connected to at least one of the first field effect transistor and the second field effect transistor and supplying the temperature compensated bias voltage to the at least one of the first field effect transistor and the second field effect transistor.

8. The RF power amplifier of claim 7, wherein the temperature compensating bias circuitry further comprises a second amplifier having an output providing a second temperature dependent voltage based on the temperature signal,
wherein the first temperature dependent voltage and the second temperature dependent voltage change at substantially the same rate in response to the temperature signal, and
wherein the potentiometer is connected to the output of the first amplifier and the output of the second amplifier such that a voltage across the potentiometer remains substantially constant when the first temperature dependent voltage and the second temperature dependent voltage change.

9. The RF power amplifier of claim 8, further comprising a follower transistor connected to the potentiometer, wherein the follower transistor generates the bias output.

10. The RF power amplifier of claim 7, wherein the temperature sensor is a transistor.

11. The RF power amplifier of claim 7, wherein the temperature sensor comprises a temperature sensor integrated circuit.

12. The RF power amplifier of claim 7, further comprising a temperature output signal transmitting a temperature of the RF power amplifier.

13. The RF power amplifier of claim 7, further comprising a transistor dump signal for deactivating at least one of the first field effect transistor and the second field effect transistor.

14. The RF power amplifier of claim 7, wherein the first field effect transistor includes a first gate, a first source, and a first drain,
wherein the second field effect transistor includes a second gate, a second source, and a second drain, the RF power amplifier further comprising:
a broadband output transformer having a first balanced input and a second balanced input, wherein the broadband output transformer has an input to output impedance ratio of 1:4, and further wherein at least some flux cancellation occurs within the broadband output transformer;
a first DC-blocking transformer connected between the first balanced input and the first drain; and
a second DC-blocking transformer connected between the second balanced input and the second drain.

15. The RF power amplifier of claim 14, wherein each one of the broadband output transformer, the first DC-blocking transformer, and the second DC-blocking transformer include a cable having a characteristic impedance of approximately or exactly 25 ohms.

16. The RF power amplifier of claim 14, wherein the first DC-blocking transformer provides a negative feedback signal to the first field effect transistor, and wherein the second DC-blocking transformer provides a negative feedback signal to the second field effect transistor.

17. The RF power amplifier of claim 14, further comprising another transformer, which provides negative feedback signals to the first field effect transistor and the second field effect transistor.

18. The RF power amplifier of claim 14, further comprising an RF output terminal; and
an output balun transformer connected between the broadband output transformer and the RF output terminal.

19. An RF power amplifier, comprising:
a push-pull amplifier, the push-pull amplifier comprising a first field effect transistor having a first drain and a second field effect transistor having a second drain;
a broadband output transformer having a first balanced input and a second balanced input;
a first DC-blocking transformer connected between the first balanced input and the first drain; and
a second DC-blocking transformer connected between the second balanced input and the second drain.

20. The RF power amplifier of claim 19, further comprising temperature compensating bias circuitry for providing a temperature compensated bias voltage to the first field effect transistor and the second field effect transistor for decreasing the bias voltage of the first field effect transistor and the second field effect transistor as transistor temperature increases.

21. The RF power amplifier of claim 19, wherein each one of the broadband output transformer, the first DC-blocking transformer, and the second DC-blocking transformer include a cable having a characteristic impedance of approximately or exactly 25 ohms.

22. The RF power amplifier of claim 19, wherein the first DC-blocking transformer provides a negative feedback signal to the first field effect transistor, and wherein the second DC-blocking transformer provides a negative feedback signal to the second field effect transistor.

23. The RF power amplifier of claim 19, further comprising another transformer, which provides negative feedback signals to the first field effect transistor and the second field effect transistor.

24. The RF power amplifier of claim 19, wherein the broadband output transformer has an input to output impedance ratio of 1:4, and further wherein at least some flux cancellation occurs within the broadband output transformer.

25. The RF power amplifier of claim 24, further comprising an RF output terminal; and
an output balun transformer connected between the broadband output transformer and the RF output terminal.

26. The RF power amplifier of claim 19, wherein the broadband output transformer has unbalanced outputs and an input to output impedance ratio of 1:1.

27. The RF power amplifier of claim 26, further comprising an RF output terminal; and
an unbalanced-to-unbalanced transformer connected between the broadband output transformer and the RF output terminal.

28. The RF power amplifier of claim 27, wherein the unbalanced-to-unbalanced transformer has an input to output impedance ratio of 1:4.

29. An RF power amplifier, comprising:
a first amplifier module comprising a first push-pull amplifier including a plurality of field effect transistors and a first output balun transformer, wherein an output impedance of the first amplifier module is 25 ohms;
a second amplifier module comprising a second push-pull amplifier including a plurality of field effect transistors and a second output balun transformer, wherein an output impedance of the second amplifier module is 25 ohms;
a combiner connected to the first amplifier module and the second amplifier module, the combiner comprising an unbalanced-to-unbalanced output transformer having an input-to-output impedance ratio of 1:4, wherein the combiner combines an output from the first amplifier module and an output from the second amplifier module into a combined signal, wherein the combined signal is supplied to the unbalanced-to-unbalanced output transformer, and wherein an output impedance of the combiner is 50 ohms.

30. The RF power amplifier of claim 29, wherein the first amplifier module includes a plurality of DC-blocking transformers, and wherein the second amplifier module includes a plurality of DC-blocking transformers.

* * * * *